United States Patent [19]
Iwasa

[11] Patent Number: 5,291,047
[45] Date of Patent: Mar. 1, 1994

[54] FLOATING GATE TYPE ELECTRICALLY PROGRAMMABLE READ ONLY MEMORY CELL WITH VARIABLE THRESHOLD LEVEL IN ERASED STATE

[75] Inventor: Shoichi Iwasa, Tokyo, Japan

[73] Assignee: NEC Corporation, Tokyo, Japan

[21] Appl. No.: 776,017

[22] Filed: Oct. 15, 1991

[30] Foreign Application Priority Data

Oct. 12, 1990 [JP] Japan ................... 2-274787

[51] Int. Cl.$^5$ ............... H01L 29/68; H01L 29/34; H01L 29/06
[52] U.S. Cl. .................. 257/318; 257/319; 257/320; 257/324; 257/326
[58] Field of Search ............ 257/318, 319, 320, 324, 257/325, 326, 314, 315, 316, 317; 365/185

[56] References Cited

U.S. PATENT DOCUMENTS

| | | | |
|---|---|---|---|
| 4,404,577 | 9/1983 | Cranford, Jr. et al. | 257/320 |
| 4,630,087 | 12/1986 | Momodomi | 257/320 |
| 5,034,798 | 7/1991 | Ohsima | 257/324 |
| 5,051,794 | 9/1991 | Mori | 257/324 |

FOREIGN PATENT DOCUMENTS

| | | | |
|---|---|---|---|
| 59-33881 | 2/1984 | Japan | 257/316 |
| 60-175437 | 9/1985 | Japan | 257/317 |
| 1-89372 | 4/1989 | Japan | 257/317 |

*Primary Examiner*—Ngan Ngo
*Attorney, Agent, or Firm*—Sughrue, Mion, Zinn, Macpeak & Seas

[57] ABSTRACT

An electrically programmable read only memory device accumulates electrons in a floating gate electrode so as to change the threshold level at a first control gate electrode capacitively coupled with the floating gate electrode, and a second control gate electrode is further capacitively coupled with the floating gate electrode through a composite gate insulating film structure implemented by a silicon nitride film sandwiched between silicon oxide films, when the electrons are evacuated from the floating gate electrode in ultra-violet radiation, the second control gate electrode is biased to a certain voltage level lower than a virgin threshold level provided upon completion of a fabricating process so that the threshold level is lowered rather than the virgin threshold level for speed up of a read-out operation.

9 Claims, 6 Drawing Sheets

FLOATING GATE TYPE ELECTRICALLY PROGRAMMABLE READ ONLY MEMORY CELL WITH VARIABLE THRESHOLD LEVEL IN ERASED STATE

FIELD OF THE INVENTION

This invention relates to a floating gate type electrically programmable read only memory cell and, more particularly, to a composite gate insulating film structure for varying a threshold level after an erasing operation.

DESCRIPTION OF THE RELATED ART

The floating gate type field effect transistor provides an electrically programmable read only memory cell, and an example of the prior art electrically programmable read only memory cell is illustrated in FIG. 1. Although various inter-level insulating films and gate insulating films are laminated on a p-type silicon substrate or a p-type well 1 doped with p-type impurity atoms at $6 \times 10^{16}$ atoms/cm$^3$, they are deleted from the multilevel structure for the sake of simplicity. A thick field oxide film 2 is selectively grown on the silicon substrate as well as the p-type well 1, and n-type impurity regions are formed in the major surface of the p-type well 1. The n-type impurity regions serve as a control gate 3, a first active region 4 for a write-in transistor and a second active region 5 for a read-out transistor, and the first and second active regions 4 and 5 are contiguous to each other. After a channel doping independently carried out for the read-out transistor, a first gate insulating film of silicon oxide (not shown) is grown on a channel forming region of the first active region 4, and a channel forming region of the second active region 5 is also covered with a second gate insulating film of silicon oxide (not shown). In this instance, the channel forming regions are doped with n-type impurity atoms at $1 \times 10^{14}$ to $1 \times 10^{15}$ atoms/cm$^3$ for the read-out transistor, and the write-in transistor is not subjected to any channel doping. For this reason, the threshold level of the read-out transistor is lower than that of the write-in transistor. On the control gate 3 is grown a third gate insulating film (not shown) which is also formed of silicon oxide.

A floating gate electrode 6 of polysilicon extends over the thick field oxide film 2, and covers the first to third gate insulating films. Namely, a trunk portion 6a is located over the control gate 3, and two projections 6b and 6c are respectively provided over the channel forming regions of the first and second active regions 4 and 5. For clear discrimination, the floating gate electrode 6 is hatched in FIG. 1. Though not shown in FIG. 1, the floating gate electrode 6 is covered with a first inter-level insulating film, and conductive strips are patterned on the first inter-level insulating film. The conductive strips 7 and 9 on both sides serve as first and second bit lines 7 and 9, respectively, and the other conductive strip provides a source line 8. Contact holes 10, 11 and 12 are formed in the first inter-level insulating film, and are laterally spaced apart from one another by the first and second gate insulating films. The first and second bit lines 7 and 9 are held in contact through the contact holes 10 and 12 with the first and second active regions 4 and 5, and the source line 8 passes through the other contact hole 11 so as to be brought into contact with the second active region 5. A second inter-level insulating film (not shown) is provided over the entire surface of the structure. The first bit line 7, the first active region 4, the first gate insulating film, the projection 6b and the source line 8 as a whole constitute the write-in transistor, and the second bit line 9, the second active region 5, the second gate insulating film, the projection 6c and the source line 8 form in combination the read-out transistor.

The prior art electrically programmable memory cell thus arranged is erased with ultra-violet radiation, and a write-in operation and a read-out operation are carried out through the write-in transistor and the read-out transistor, respectively. Namely, the first bit line 7 is positively biased with respect to the p-type well 1, and hot electrons produced at the p-n junction therebetween are injected into the floating gate electrode 6 under positive biased state of the control gate 3. Since the p-type well 1 is heavily doped with p-type impurity atoms rather than the channel forming region of the second active region 5, a large amount of hot electrons are produced and injected into the floating gate electrode 6, and the write-in transistor enhances the write-in efficiency.

In the read-out operation, the control gate electrode 3 is biased to a positive read-out voltage level. If the write-in operation has been carried out, no conductive channel takes place in the channel forming region of the second active region 5, the voltage level on the second bit line 9 is kept constant. On the other hand, if the electrically programmable read only memory cell remains erased, a conductive channel takes place, and current passing therethrough decays the voltage level on the second bit line 9. Since the p-type impurity concentration of the channel forming region in the second active region 5 is light, the threshold level of the read-out transistor is lower than that of the write-in transistor by 1.5 volts to 3.0 volts, and, for this reason, the read-out voltage level at the control gate 3 is as low as 0.8 volt to 0.9 volt. Thus, the prior art electrically programmable read only memory cell shown in FIG. 1 is operative with a low power voltage level such as, for example, 1.5 volts.

FIG. 2 shows another prior art electrically programmable read only memory cell implemented by combination of a read-out transistor and a write-in transistor. Inter-level insulating films and gate insulating films are also deleted from the electrically programmable read only memory cell shown in FIG. 2. In a p-type silicon substrate and a p-type well 21 doped with p-type impurity atoms at 6 to $10 \times 10^{16}$ atoms/cm$^3$ is selectively grown a thick field oxide film 22 which defines an n-type impurity region for providing first and second drain regions 23 and 24 and a source region 25. In order to lower the threshold level of the read-out transistor rather than the threshold level of the write-in transistor, channel doping is carried out for the read-out transistor independently from the write-in transistor, and first and second gate insulating films of silicon oxide are grown over channel forming regions between the first and second drain regions 23 and 24 and the source region 25. The channel forming region of the write-in transistor is not subjected to channel doping, and the channel forming region of the read-out transistor is doped at $1 \times 10^{14}$ to $1 \times 10^{15}$ atoms/cm$^2$. A floating gate electrode 26 of polysilicon laterally extends over the channel forming regions, and is wrapped with a third gate insulating film of silicon oxide. A control gate electrode 27 extends on the third gate insulating film, and is partially overlapped with the floating gate electrode 26. For easy discrimination, hatching lines are drawn for the floating gate electrode 6. A first inter-level insulating film (not shown) covers the control gate electrode 27 and the n-type impurity region, and contact holes 28 and 29 are formed in the first inter-level insulating film. First and second bit lines 30 and 31 extend over the first inter-level insulating film, and are held in contact with the first and second drain regions 23 and 24 through the contact holes, respectively.

This second prior electrically programmable read only memory cell occupies a smaller amount of space on the silicon substrate rather than the first prior art example shown in FIG. 1; however, the second prior art example behaves in a similar manner to the prior art electrically programmable read only memory device shown in FIG. 1. For this reason, no further description is incorporated hereinbelow.

A problem is encountered in the prior art electrically programmable read only memory cells in that process sequences are complex. This is because of the fact that the channel doping stages are carried out for the read-out transistors independently from the write-in transistors. The threshold levels in the erased state are not variable after completion of the structures, because the threshold levels are fixedly determined by the individual channel doping stages.

Another problem inherent in the prior art electrically programmable read only memory cells is a large amount of occupation area. As described hereinbefore, the combination of the write-in and read-out transistors achieve a high injection efficiency without sacrifice of high speed read-out operation under a low read-out voltage level. However, those transistors increase the occupation area for a single memory cell. Moreover, the threshold levels of the read-out transistors and, accordingly, the impurity concentrations of the channel forming regions are so low that undesirable punch-through phenomenon is liable to take lace. The channel lengths are extended so as to prevent the read-out transistors from exhibiting the punch-through phenomenon, and, accordingly, the occupation areas are expanded in a direction perpendicular to the bit lines 7 and 8 as well as in a direction parallel to the bit lines 30 and 31. Thus, the read-out transistors per se and the extended channel length cause the wide occupation area, and hardly allow for increasing the integration densities. Moreover, when the channel forming regions of the read-out transistors are extended, the associated read-out transistors are also extended between the contact holes 10 and 28 and the floating gate electrodes 6b and 26, and the drain resistances are undesirably increased.

SUMMARY OF THE INVENTION

It is therefore an important object of the present invention to provide a floating gate type electrically programmable read only memory cell which is fabricated through a simple process without sacrifice of injection efficiency of hot electrons.

It is also an important object of the present invention to provide a floating gate type electrically programmable read only memory cell implemented by a single floating gate type field effect transistor which achieves a high carrier injection efficiency as well as a high speed read-out operation with a low read-out voltage level.

It is yet another object of the present invention to provide a method of shifting a floating gate type electrically programmable read only memory cell into an erased state which can regulate the threshold level to an arbitrary value.

To accomplish these objects, the present invention proposes to capacitively couple a second control gate electrode with a floating gate electrode through a third composite gate insulating film structure implemented by a silicon nitride film sandwiched between silicon oxide films.

In accordance with one aspect of the present invention, there is provided an electrically programmable read only memory cell comprising a) source and drain regions spaced apart from each other by a channel forming region, b) a floating gate electrode capacitively coupled with the channel forming region through a first gate insulating film, c) a first control gate electrode electrically isolated from the source and drain regions and the channel forming region, and capacitively coupled with the floating gate electrode through a second composite gate insulating film structure implemented by a silicon nitride film sandwiched between silicon oxide films, the first control gate electrode being biased in a write-in operation and a read-out operation, and d) a second control gate electrode electrically isolated from the source and drain regions, the channel forming region and the first control gate electrode, and capacitively coupled with the floating gate electrode through a third composite gate insulating film structure implemented by a silicon nitride film sandwiched between silicon oxide films, the second control gate electrode being biased when the floating gate electrode is exposed to optical radiation in an erased operation.

In accordance with another aspect of the present invention, there is provided an electrically programmable read only memory device fabricated on a well formed in a single semiconductor chip, comprising: a plurality of memory cells each selectively entering an erased state and a write-in state for memorizing a data bit read out therefrom in a read-out operation, each of the memory cell comprising a) source and drain regions formed in the well and spaced apart from each other by a channel forming region, b) a floating gate electrode capacitively coupled with the channel forming region through a first gate insulating film, c) a first control gate electrode electrically isolated from the source and drain regions and the channel forming region, and capacitively coupled with the floating gate electrode through a second composite gate insulating film structure implemented by a silicon nitride film sandwiched between silicon oxide films, the first control gate electrode being biased in a write-in operation and a read-out operation, and d) a second control gate electrode electrically isolated from the source and drain regions, the channel forming region and the first control gate electrode, and capacitively coupled with the floating gate electrode through a third composite gate insulating film structure implemented by a silicon nitride film sandwiched between silicon oxide films, the second control gate electrode being biased when the floating gate electrode is exposed to optical radiation in an erased operation.

In accordance with yet another aspect of the present invention, there is provided a method of shifting an electrically programmable read only memory cell into an erased state, the electrically programmable read only memory cell having source and drain regions fabricated in a semiconductor substrate and spaced apart by a channel forming region, a floating gate electrode capacitively coupled with the channel forming region through a first gate insulating film, a first control gate electrode capacitively coupled with the floating gate electrode through a second composite gate insulating film structure implemented by a silicon nitride film sandwiched between silicon oxide films, and a second control gate electrode capacitively coupled with the floating gate electrode through a third composite gate insulating film structure implemented by a silicon nitride film sandwiched between silicon oxide films, the electrically programmable read only memory cell having a virgin threshold level upon completion of a fabricating process, the method comprising the steps of: a) exposing the floating gate electrode to optical radiation for evacuating carrier therefrom under application of a lower voltage level than the virgin threshold level to the second control gate electrode, the semiconductor substrate being grounded, and b) maintaining the step a) for a predetermined time period for providing a threshold level between the virgin threshold level and a ground voltage level to the electrically programmable read only memory cell.

BRIEF DESCRIPTION OF THE DRAWINGS

The features and advantages of the floating gate type field effect transistor according to the present invention will be more clearly understood from the following description taken in conjunction with the accompanying drawings in which.

DESCRIPTION OF THE PREFERRED EMBODIMENTS

First Embodiment

Figure 1:
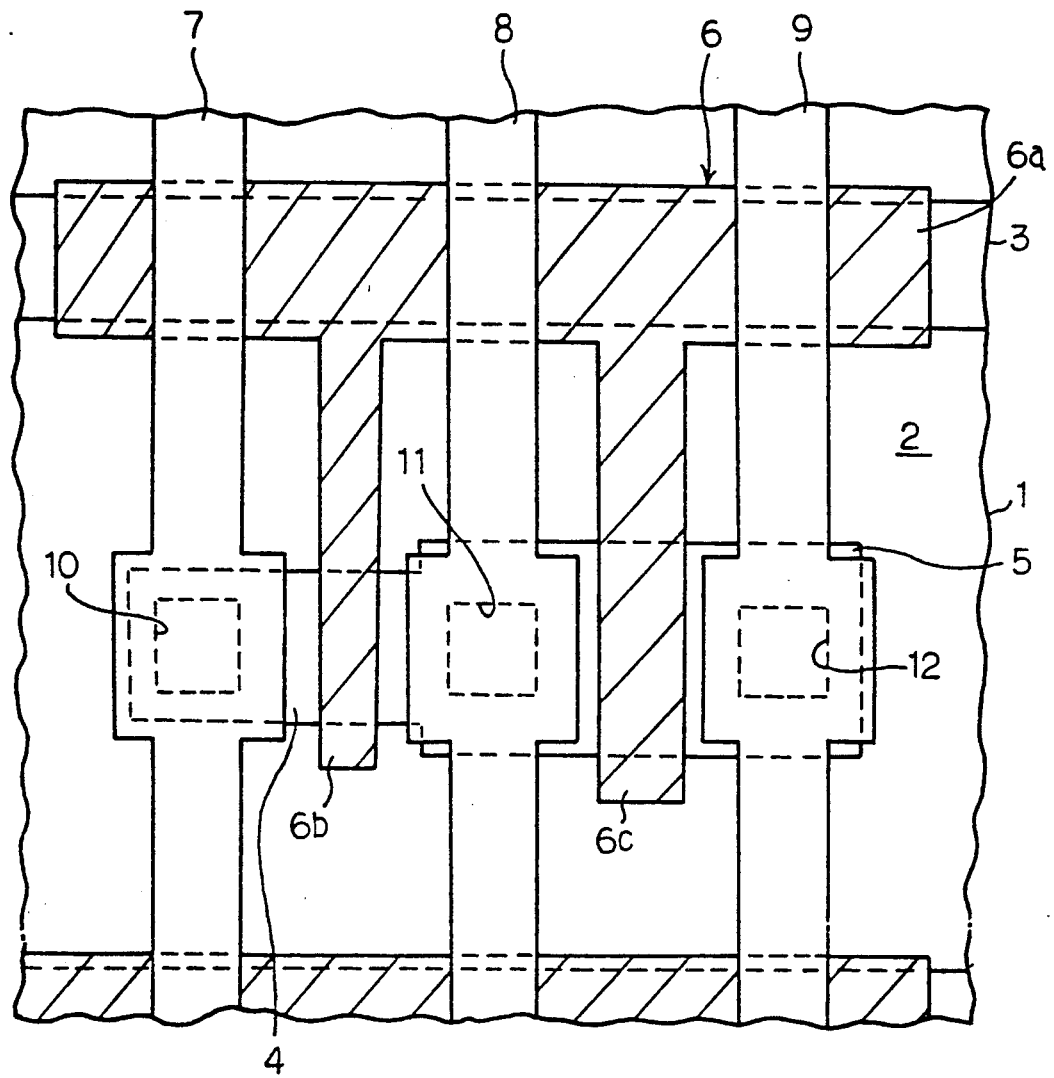
FIG. 1 is a plan view showing the layout of the prior art electrically programmable read only memory cell.
Figure 2:
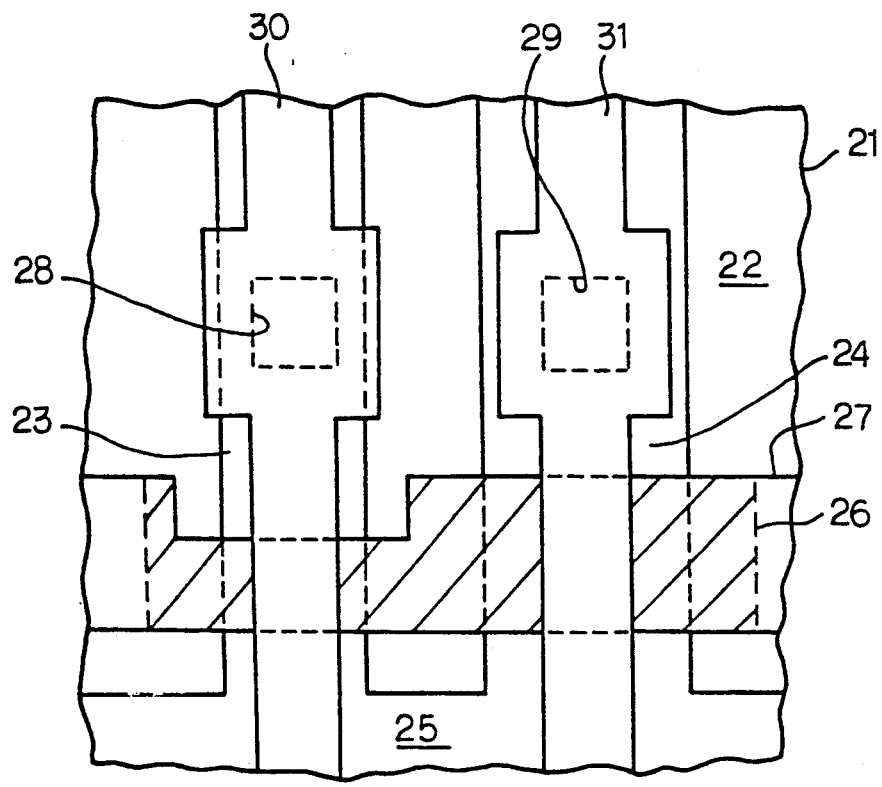
FIG. 2 is a plan view showing the layout of another prior art electrically programmable read only memory cell.
Figure 3:
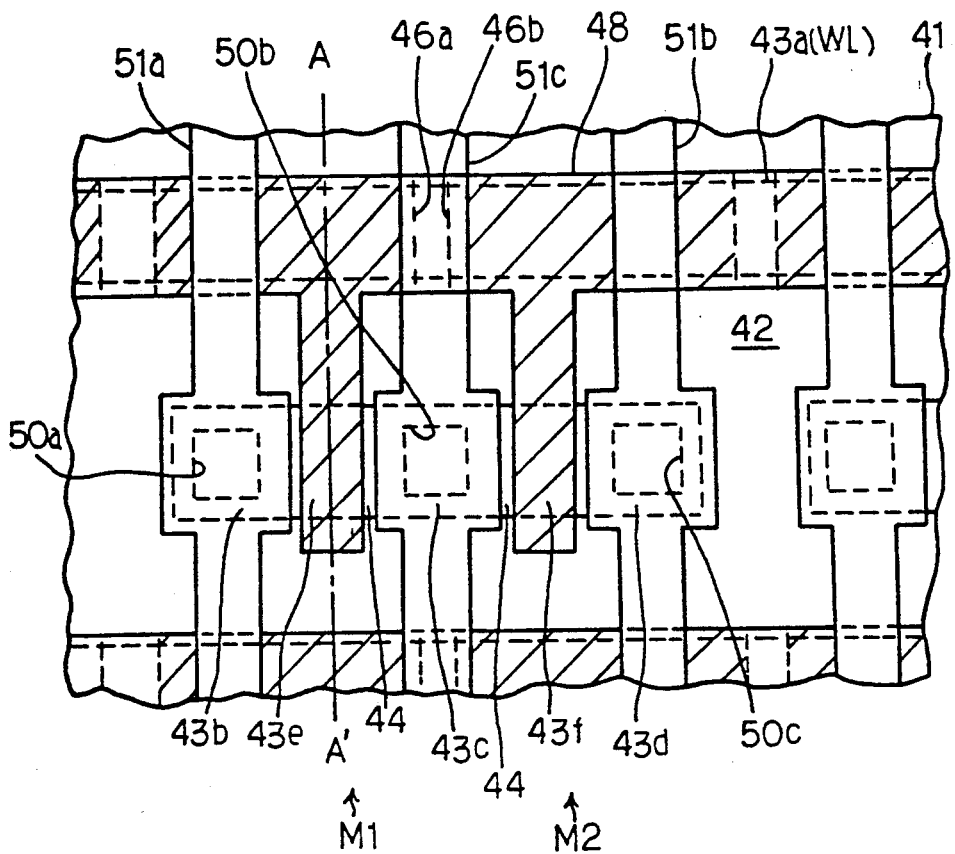
FIG. 3 is a plan view showing the layout of an electrically programmable read only memory cell according to the present invention.
Figure 4:
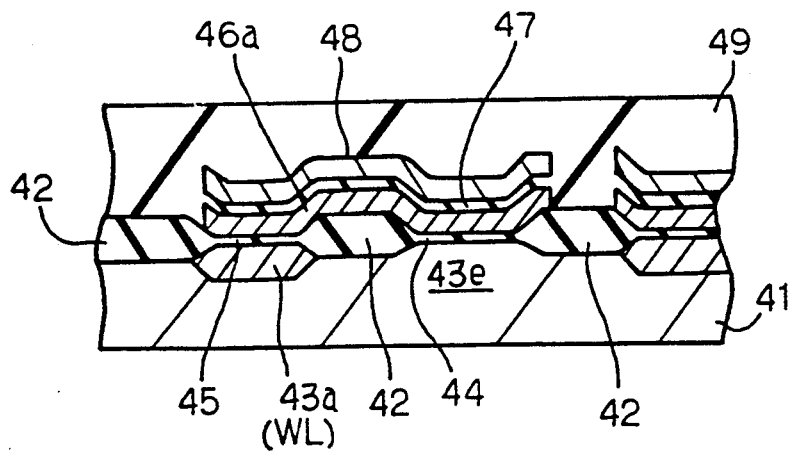
FIG. 4 is a cross sectional view taken along line A—A' of FIG. 3 and showing the structure of the electrically programmable read only memory cell.

Referring to FIGS. 3 and 4 of the drawings, an electrically programmable read only memory cell embodying the present invention is fabricated on a p-type well 41 doped with p-type impurity atoms at 3 to $6 \times 10^{13}$ atoms/cm$^2$. Although various inter-level insulating films are incorporated in the structure of the electrically programmable read only memory device fabricated on a single lightly doped p-type silicon substrate, the inter-level insulating films are deleted from FIG. 3 for the sake of simplicity. On the major surface of the lightly doped silicon substrate and, accordingly, the heavily doped p-type well 41 is grown a thick field oxide film 42 which defines n-type impurity regions, and the n-type impurity regions provide a first control gate 43a or a word line WL shared between a plurality of electrically programmable read only memory cells and source/drain regions 43b, 43c and 43d. Between the source/drain regions 43b, 43c and 43d are provided channel forming regions 43e and 43f for which channel doping is simultaneously carried out. In this instance, it is preferable that the channel forming regions 43e and 43f are not subjected to channel doping. First gate insulating films 44 of silicon oxide are grown on the channel forming regions 43e and 43f to a thickness of about 250 angstroms, and second composite gate insulating film structures 45 are provided on the first control gate 43a. Each of the second composite gate insulating film structures 45 is implemented by a silicon nitride film sandwiched between two silicon oxide films, and the thickness of the second composite gate insulating film structures 45 is equivalent to a silicon oxide film of about 250 angstroms in view of dielectric constant. On the second composite gate insulating film structures 45 are patterned floating gate electrodes 46a and 46b of polysilicon which are capacitively coupled with the first control gate 43a through the second composite gate insulating film structures 45. The floating gate electrodes 46a and 46b respectively extend over the first gate insulating films 44, and, accordingly, are capacitively coupled with the channel forming regions 43e and 43f through the first gate insulating films. For easy discrimination, the floating gate electrodes 46a and 46b are hatched in FIG. 3.

Figure 5:
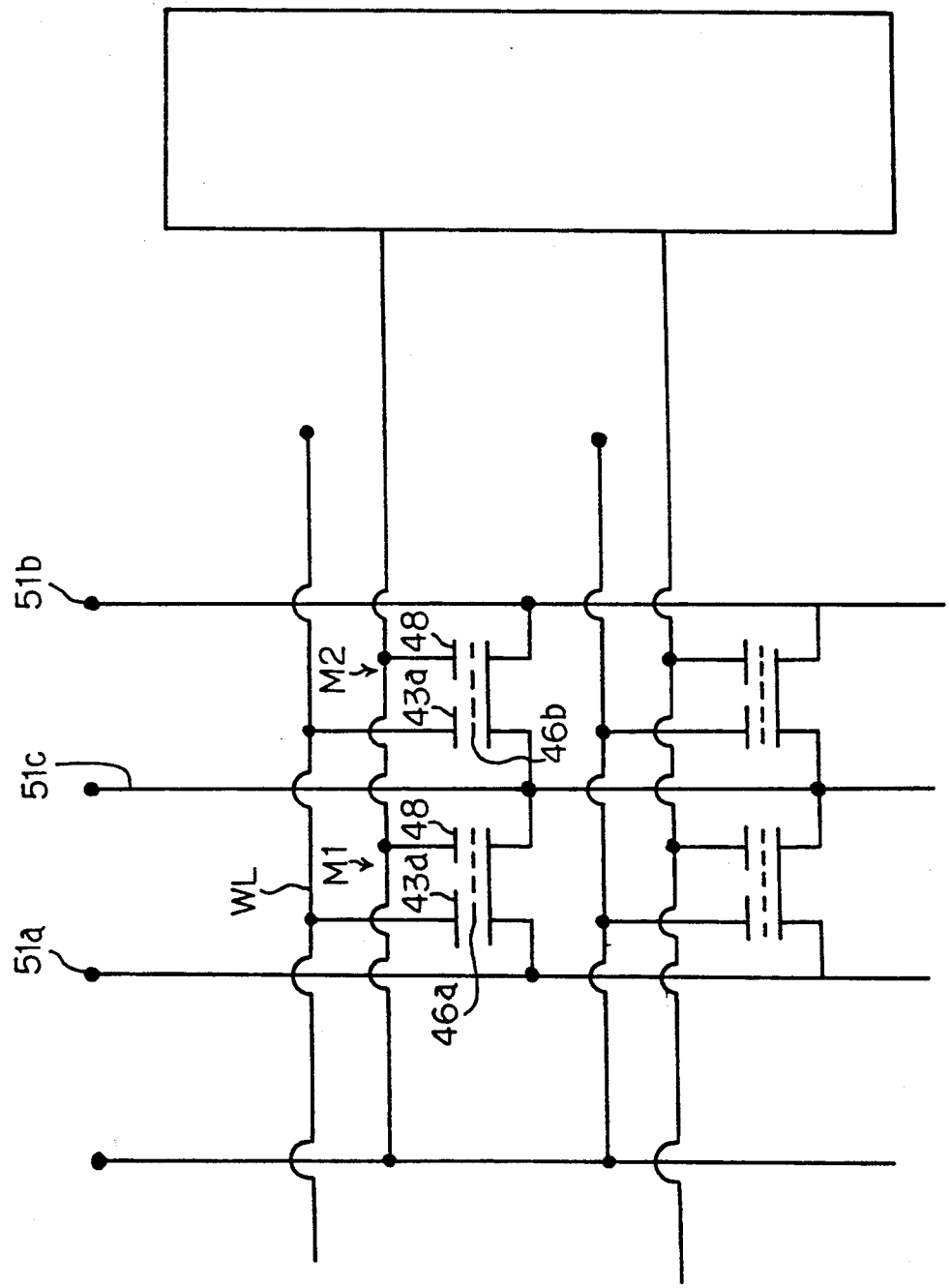
FIG. 5 is a circuit diagram showing the arrangement of an essential part of an electrically programmable read only memory device according to the present invention.

The floating gate electrodes 46a and 46b are covered with third composite gate insulating film structures 47, and each of the third composite gate insulating film structures 47 is implemented by a silicon nitride film sandwiched between the silicon oxide films. In this instance, each of the third composite gate insulating film structures is equivalent to a silicon oxide film of about 250 angstroms in view of dielectric constant. A second control gate 48 is formed on the third composite gate insulating film structures 47, and is overlapped with the floating gate electrodes 46a and 46b. In other words, the floating gate electrodes 46a and 46b are capacitively coupled with the second control gate 48 through the associated second composite gate insulating film structures 47. The source/drain regions 43b and 43c, the channel forming region 43e, the first gate insulating film 44, the floating gate electrode 46a, the second composite gate insulating film structure 45, the first control gate 43a, the third composite gate insulating film structure 47 and the second control gate 48 as a whole constitute an electrically programmable read only memory cell M1, and the source/drain regions 43c and 43d, the channel forming region 43f, the first gate insulating film 44, the floating gate electrode 46b, the second composite gate insulating film structure 45, the first control gate 43a, the third composite gate insulating film structure 47 and the second control gate 48 form in combination an electrically programmable read only memory cell M2. The electrically programmable read only memory cells M1 and M2 form parts of an electrically programmable read only memory device as shown in FIG. 5.

Turning back to FIGS. 3 and 4, the memory cells M1 and M2 are covered with a first inter-level insulating film 49, and contact holes 50a, 50b and 50c are formed in the first inter-level insulating film 49. Bit lines 51a and 51b and a source line 51c extend over the first inter-level insulating film 49, and are held in contact with the source/drain regions 43b, 43d and 43c through the contact holes 50a, 50c and 50b. Though not shown in the drawings, the bit lines 51a and 51b and the source line 51c are covered with a second inter-level insulating film, and appropriate peripheral circuits are associated with the first control gate 43a, the bit lines 51a and 51b, the source line 51c and the second control gate 48.

The electrically programmable read only memory device thus fabricated selectively enters a write-in phase, a read-out phase and an erased phase of operation. Assuming now that the electrically programmable read only memory device is fabricated through an appropriate process sequence, no electron is accumulated in the floating gate electrodes 46a and 46b, and the electrically programmable read only memory cells M1 and M2 have a virgin threshold level upon completion. In this instance, the virgin threshold level is as high as 1.5 volts.

In a programming sequence, the word line WL or the first control gate 43a is elevated to a first extremely high write-in voltage level of about 12.5 volts, and the bit line 51a goes up to a second extremely high voltage level of about 7 volts. Then, hot electrons are produced around the channel forming region 43e, and are attracted toward the floating gate electrode 46a. The hot electrons are accumulated in the floating gate electrode 46a, and the electrically programmable read only memory cell M1 enters a write-in state where the electrically programmable read only memory cell M1 has a first threshold level of about 9.2 volts higher than a first read-out voltage level of about 1.5 volt. Since the channel forming region 43e is heavily doped, high injection efficiency is achieved.

In the read-out phase of operation, the word line WL and the first control gate 43a are biased to the first read-out voltage level of 1.5 volt, and the bit line 51a is applied with a second read-out voltage level of 1.0 volt. Since the first threshold level is higher than the first read-out voltage level, no current path is established between the drain region 43b and the source region 43c, and the write-in state is detectable by monitoring the voltage level on the bit line 51a.

Figure 6:
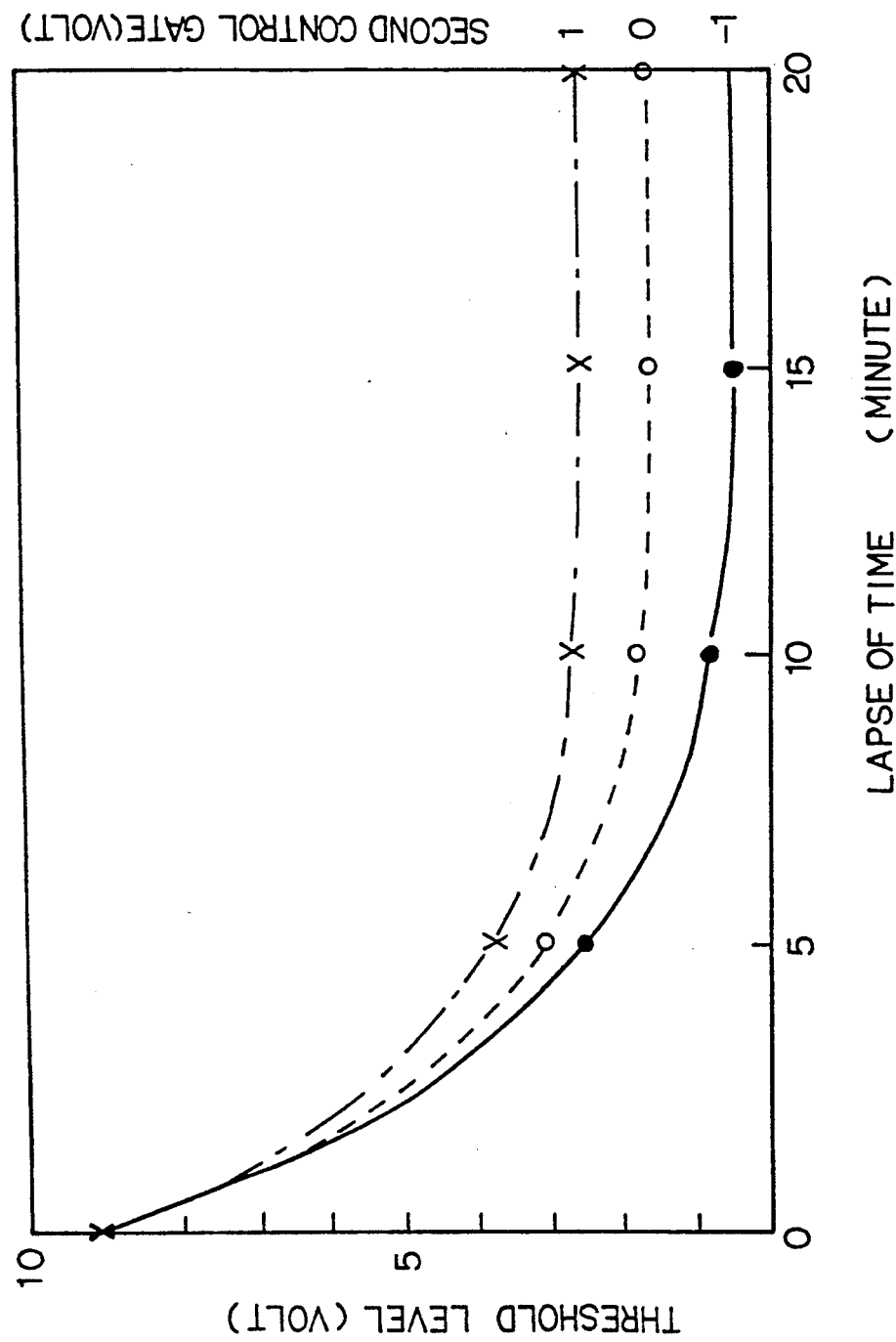
FIG. 6 is a graph showing variable threshold level in terms of erasing conditions.

In order to simultaneously shift the electrically programmable read only memory cells M1 and M2 into the erased state, the p-type well 41 is grounded, and the second control gate 48 is negatively biased to a predetermined voltage level with respect to the virgin threshold level. However, the first control gate 43a is kept in floating state. The floating gate electrodes 46a and 46b are exposed to ultra-violet light with wavelength of 254 nanometer for 20 minutes. If the predetermined voltage level is adjusted to −1.0 volt, the electrically programmable read only memory cells M1 and M2 decreases the threshold level from 9.2 volts to 0.4 volt as shown in FIG. 6. After the electrically programmable read only memory cell M1 enters the erased state, a current path is provided in the presence of the first read-out voltage level of 1.5 volts, and a high speed read-out operation is achieved with a low power voltage level.

Second Embodiment

Figure 7:
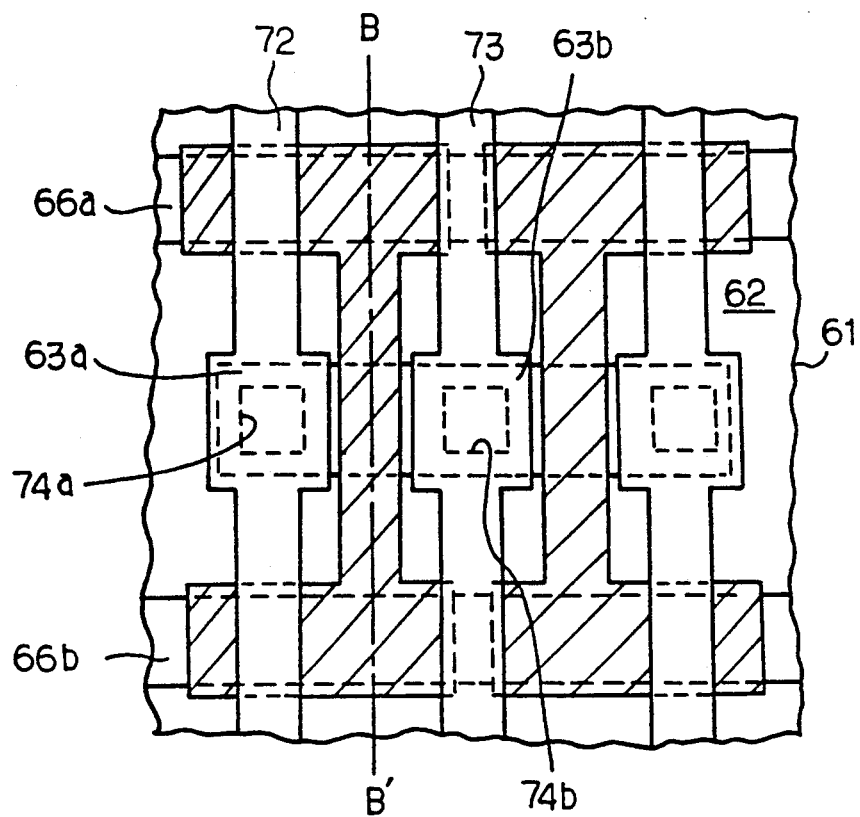
FIG. 7 is a plan view showing the layout of another electrically programmable read only memory cell according to the present invention.
Figure 8:
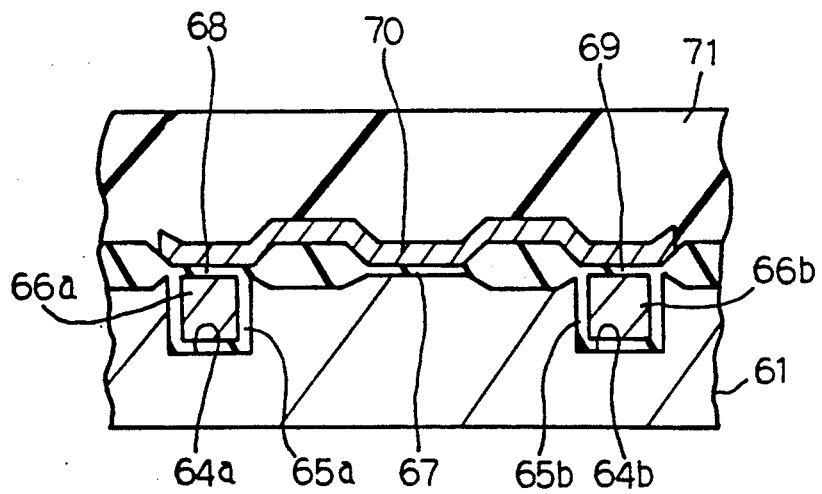
FIG. 8 is a cross sectional view taken along line B—B' of FIG. 7 and showing the structure of the electrically programmable read only memory cell.

Turning to FIGS. 7 and 8 of the drawings, another electrically programmable read only memory cell embodying the present invention is fabricated on a heavily doped p-type well defined in a lightly doped p-type silicon substrate. A thick field oxide film 62 is selectively grown on the lightly doped p-type substrate and, accordingly, the heavily doped p-type well 61, and n-type impurity regions are formed for drain and source regions 63a and 63b. Two grooves 64a and 64b are formed in the p-type well 61, and extend substantially parallel to each other. Thick silicon oxide films 65a and 65b of about 1000 angstroms cover the walls of the grooves 64a and 64b, and n-type doped polysilicon blocks 66a and 66b fill the secondary grooves defined by the silicon oxide films 65a and 65b, respectively. The polysilicon blocks 66a and 66b serve as first and second control gate electrodes, respectively. On a channel forming region between the drain and source regions 63a and 63b is grown a first gate insulating film 67 of silicon oxide which is as thin as about 250 angstroms. The polysilicon blocks 66a and 66b are covered with second and third composite gate insulating film structures 68 and 69 each implemented by a silicon nitride film sandwiched between silicon oxide films, and the second and third composite gate insulating film structures 68 and 69 are equivalent to a silicon oxide film of about 250 angstroms in view of the dielectric constant.

A floating gate electrode 70 extends over the first gate insulating film 67 as well as over the second and third composite gate insulating film structures 68 and 69, and is hatched for the sake of easy discrimination in FIG. 7. A first inter-level insulating film 71 covers the entire surface of the structure, and bit and source lines 72 and 73 are held in contact with the drain and source regions 63a and 63b through contact holes 74a and 74b formed in the first inter-level insulating film 71. Though not shown in the drawings, the bit and source lines 72 and 73 are covered with a second inter-level insulating film.

The behaviors and the advantages of the electrically programmable read only memory cell implementing the second embodiment are similar to those of the first embodiment. However, the electrically programmable read only memory device shown in FIGS. 7 and 8 further has an advantage in a simplified fabrication process. Namely, the second and third composite gate insulating film structures are concurrently patterned from laminated silicon nitride film and silicon oxide films, and the concurrent patterning stage simplifies the process sequence. Another additional advantage achieved by the second embodiment is a high breakdown voltage level on the first control gate electrode 66a. The control gate 43a is implemented by the n-type impurity region, and electrically isolation is provided by the p-n junction. However, the polysilicon block 66a or the first control gate electrode is wrapped with insulator, and the isolation is hardly broken. The polysilicon blocks 66a and 66b are further advantageous in parasitic capacitance because of the thick silicon oxide films 65a and 65b.

As will be understood from the foregoing description, the electrically programmable read only memory cell according to the present invention is implemented by a single floating gate type field effect transistor so as to achieve high carrier injection efficiency as well as a high speed read-out operation with a low read-out voltage level. This results in a small amount of occupation area.

Moreover, no additional channel doping is necessary, because a low threshold level is achieved by biasing the second control gate electrode. This results in a simple fabrication process.

Although particular embodiments of the present invention have been shown and described, it will be obvious to those skilled in the art that various changes and modifications may be made without departing from the spirit and scope of the present invention. For example, ultra-violet light with another wavelength may be used in the erasing operation, and different biasing voltage level on the second control gate electrode and different lapse of time may be selected for the erasing operation.

What is claimed is:

1. An electrically programmable read only memory cell comprising
   a) source and drain regions spaced apart from each other by a channel forming region,
   b) a floating gate electrode capacitively coupled with said channel forming region through a first gate insulating film,
   c) a first control gate electrode electrically isolated from said source and drain regions and said channel forming region, and capacitively coupled with said floating gate electrode through a second composite gate insulating film structure implemented by a silicon nitride film sandwiched between silicon oxide films, said first control gate electrode being biased in a write-in operation and a read-out operation, and
   d) a second control gate electrode electrically isolated from said source and drain regions, said channel forming region and said first control gate electrode, and capacitively coupled with said floating gate electrode through a third composite gate insulating film structure implemented by a silicon nitride film sandwiched between silicon oxide films, said second control gate electrode being arranged to be biased in response to exposure of said floating gate electrode to optical radiation in an erase operation that changes a threshold voltage at said first control gate electrode with respect to said channel forming region.

2. An electrically programmable read only memory cell as set forth in claim 1, in which said source and drain regions are formed in a part of a semiconductor bulk body, and in which said first control gate electrode is formed in said semiconductor bulk body at spacing relationship from said source and drain regions.

3. An electrically programmable read only memory device as set forth in claim 2, in which said floating gate electrode is formed over said semiconductor bulk body, and has a trunk portion capacitively coupled with said first control gate electrode through said second composite gate insulating film structure, and a branch portion projecting from said trunk portion and capacitively coupled with said channel forming region through said first gate insulating film.

4. An electrically programmable read only memory cell as set forth in claim 3, in which said second control gate electrode is formed over said trunk portion and said branch portion of said floating gate electrode, and capacitively coupled with said floating gate electrode through said third composite gate insulating film structure.

5. An electrically programmable read only memory cell as set forth in claim 4, in which said source and drain regions are respectively coupled with a source line and a bit line extending over a first inter-level insulating film covering said electrically programmable read only memory cell.

6. An electrically programmable read only memory cell comprising
   a) source and drain regions formed in a semiconductor bulk body, and spaced apart from each other by a channel forming region,
   b) a floating gate electrode capacitively coupled with said channel forming region through a first gate insulating film,
   c) a first control gate electrode electrically isolated from said source and drain regions and said channel forming region, and capacitively coupled with said floating gate electrode through a second composite gate insulating film structure implemented by a silicon nitride film sandwiched between silicon oxide films, said first control gate electrode being biased in a write-in operation and a read-out operation, and
   d) a second control gate electrode electrically isolated from said source and drain regions, said channel forming region and said first control gate electrode, and capacitively coupled with said floating gate electrode through a third composite gate insulating film structure implemented by a silicon nitride film sandwiched between silicon oxide films, said second control ate electrode being biased when said floating gate electrode is exposed to optical radiation in an erase operation,
   wherein at least two primary grooves are formed in said semiconductor bulk body, said primary groves are lined with insulating films for forming respective secondary groves therein, and said first and second control gate electrodes are formed in said secondary grooves, respectively.

7. An electrically programmable read only memory cell as set forth in claim 6, in which said second and third composite gate insulating film structures cover top surfaces of said first and second control gate electrodes, respectively.

8. An electrically programmable read only memory cell as set forth in claim 7, in which said floating gate electrode is located over said semiconductor bulk body, and extends over said first gate insulating film and said second and third composite gate insulating film structures.

9. An electrically programmable read only memory device fabricated on a well formed in a single semiconductor chip, comprising: a plurality of memory cells each selectively entering an erased state and a write-in state for memorizing a data bit read out therefrom in a read-out operation, each of said memory cell comprising
   a) source and drain regions formed in said well and spaced apart from each other by a channel forming region,
   b) a floating gate electrode capacitively coupled with said channel forming region through a first gate insulating film,
   c) a first control gate electrode electrically isolated from said source and drain regions and said channel forming region, and capacitively coupled with said floating gate electrode through a second composite gate insulating film structure implemented by a silicon nitride film sandwiched between silicon oxide films, said first control gate electrode being biased in a write-in operation and a read-out operation, and
   d) a second control gate electrode electrically isolated from said source and drain regions, said channel forming region and said first control gate electrode, and capacitively coupled with said floating gate electrode through a third composite gate insulating film structure implemented by a silicon nitride film sandwiched between silicon oxide films, said second control gate electrode being arranged to be biased in response to exposure of said floating gate electrode to optical radiation in an erase operation that changes a threshold voltage at said first control gate electrode with respect to said channel forming region.

* * * * *

UNITED STATES PATENT AND TRADEMARK OFFICE
CERTIFICATE OF CORRECTION

PATENT NO. : 5,291,047
DATED : March 1, 1994
INVENTOR(S) : Shoichi Iwasa

It is certified that error appears in the above-indentified patent and that said Letters Patent is hereby corrected as shown below:

Title page, item [57] Abstract, line 10, delete "gateelectrodein" and insert --gate electrode in--.

Col. 3, line 39, delete "lace" and insert --place--.

Col. 10, line 16, delete "ate" and insert --gate--.

Signed and Sealed this

Twenty-second Day of November, 1994

Attest:

BRUCE LEHMAN

Attesting Officer     Commissioner of Patents and Trademarks